United States Patent [19]
Roehrs

[11] Patent Number: 4,994,760
[45] Date of Patent: Feb. 19, 1991

[54] APPARATUS AND METHOD FOR COMBINING OUTPUT SIGNALS FROM PARALLELLY COUPLED POWER FIELD EFFECT TRANSISTORS IN HIGH FREQUENCY AMPLIFIERS

[75] Inventor: Don P. Roehrs, New River, Ariz.

[73] Assignee: Signal One Corporation, Phoenix, Ariz.

[21] Appl. No.: 364,559

[22] Filed: Jun. 7, 1989

Related U.S. Application Data

[63] Continuation of Ser. No. 96,629, Sep. 11, 1987, abandoned, which is a continuation-in-part of Ser. No. 58,592, May 26, 1987, Pat. No. 4,733,194, which is a continuation of Ser. No. 701,492, Feb. 14, 1985, abandoned.

[51] Int. Cl.$^5$ ............................................. H03F 3/68
[52] U.S. Cl. ................................... 330/295; 330/251; 330/269; 330/276; 333/100; 336/182
[58] Field of Search ................... 330/122, 124 R, 147, 330/195, 196, 197, 264, 269, 276, 295, 251; 333/100; 336/170, 175, 177, 182

[56] References Cited
U.S. PATENT DOCUMENTS
3,096,486 7/1963 Atherton ......................... 330/122 X
4,647,868 3/1987 Mueller ....................... 330/124 R X

OTHER PUBLICATIONS
Granberg, *RF Design*, Oct. 1986, pp. 44-46.

*Primary Examiner*—James B. Mullins
*Attorney, Agent, or Firm*—William W. Holloway

[57] ABSTRACT

Apparatus and method for parallel operation of radio frequency transistor amplifier circuits in a Class D mode of operation at radio frequency signal ranges without the use of frequency limiting components is disclosed. A driver circuit provides the input signals for each radio frequency transistor amplifier circuit. A transformer is disclosed that combines the output signals of the radio frequency transistor amplifier circuits while matching the amplifier circuit impedance and the transformer load impedance (i.e., the antenna impedance). The transformer eliminates the need for DC blocking capacitors between the primary and secondary windings of the transformer. The transformer/power combiner includes a plurality of (1:1) transformer units having the unit input terminals (power amplifier output signals) coupled in parallel and having unit output terminals coupled in series. The parallel/series configuration permits impedance matching of the power amplifier output impedance and impedance driven by the transformer. The primary structure of the unit transformer is metal sleeve surrounded by a ferrite core. The secondary winding includes at least one conductor cable inserted through the metal sleeve. The metal sleeve is coupled between the power amplifier output terminal and the DC power source.

18 Claims, 8 Drawing Sheets

PRIOR ART

FIG. 7A.

PRIOR ART

FIG. 7B.

PRIOR ART

APPARATUS AND METHOD FOR COMBINING OUTPUT SIGNALS FROM PARALLELLY COUPLED POWER FIELD EFFECT TRANSISTORS IN HIGH FREQUENCY AMPLIFIERS

This is a continuation of co-pending application, 07/096,629, filed on Sept. 11, 1987, abandoned, which is a continuation in part of co-pending application ob 07/058,592, filed on May 26, 1987, issued as U.S. Pat. No. 4,733,194, which is a continuation of co-pending application No. 06/701,492, filed on Feb. 14, 1985, abandoned.

BACKGROUND OF THE INVENTION

1. Field of the Invention

This invention relates generally to radio frequency amplifiers operating in the 0.5 MHz to 100 MHz frequency range and used in Class A, B, and C modes of operation and used in RF power switching amplifiers in Class D, E, F, and S modes of operation in the same frequency range.

2. Description of the Related Art

In the frequency range from approximately 0.5 MHz to 100 MHz, vacuum tubes in various configurations have been used to achieve significant output power levels. For example, power grid electron tube devices are currently employed in applications at these frequencies and can be used in Class A, B, C, D, E, F, and S modes of operation. (A general description of these modes of operation is included in "Solid State Radio Engineering," H. L. Krauss, C. W. Bostian and F. H. Raab; John Wiley and Sons, 1980, Section 14-1 through 14-6 and 16-7.) The vacuum tube devices have performed in a satisfactory manner but are relatively expensive, exhibit a maximum efficiency of approximately 50%-60% and have a limited lifetime. These devices also have narrow band characteristics when compared to semiconductors. More recently, solid state broad band devices have been fabricated that can achieve significant power at levels previously reserved for vacuum tube technology, (e.g., "Power MOSFETs versus Bipolar Transistors"; r.f. design, Nov./Dec. 1981 pages 11-15 by H. O. Cranberg). A variety of problems have prevented the solid state technology from achieving the full potential in this frequency range which the operating characteristics suggest is possible. To achieve useful power levels, the semiconductor devices must typically be operated in parallel. With respect to bipolar transistors, the low input impedances have made the use of these devices, operating in parallel, impractical. Any difference in the input capacitance in the base-emitter junction forward characteristics would result in uneven sharing of input power and unequal power output levels. The power field effect transistor (FET) devices are more tolerant in this respect because of higher input impedances. However, at higher frequencies, the same unequal sharing of input power can exist. When two power field effect transistor devices are operated in parallel, there is a tendency for the two FET devices to break into a spontaneous, relaxation type oscillation when the parasitic capacitances and stray inductances have appropriate values.

To obtain the higher power levels achievable by parallel operation of transistor devices, the implementation of the paralleling technique is provided by isolation between transistor input terminals by means of hybrid couplers, transmission lines etc. For the low impedances associated with the semiconductor devices, these implementations of isolating apparatus between semiconductor devices necessitates impedance transformation to a higher level, typically 50 ohms. The impedance transformation can be accomplished with LC matching networks or wideband radio-frequency transformers. These implementations have limited bandwidth, resulting in degradation at both high and low frequencies. Typically this type of isolation between semiconductor devices is essential only on the input side of the power amplifiers, but can also be implemented on the output side of the amplifiers.

In the case of power field effect transistor devices, the drain terminals of these devices can be coupled in parallel more easily than the collector terminals of bipolar transistor devices because the field effect transistor devices are not subject to certain failures, such as thermal runaway. The FET devices have a higher input impedance than the bipolar devices and lack the forward biased base-emitter junction. The FET gate input terminals can be directly coupled in parallel, provided that the resonance of the stray capacitances and the stray inductances of the devices are within certain values. However, with large devices, these conditions are seldom achieved and the gate terminals must be isolated, typically by apparatus similar to that of the bipolar devices. LC input and output matching networks can be used to transform the low impedance of the input and output terminals to 50 ohms, the common impedance for industrial and communications applications. It is also known to isolate Power FET devices by placing resistors in series with the gate terminals. This technique seriously degrades the frequency response and system performance. Only recently have the solid state devices become available that function usefully at the upper end and of this frequency range.

In the related art, the power output transformer typically has multiple coaxial cables (serving as the secondary winding of the transformer) passing through each ferrite core element (serving as the primary winding of the transformer) and requires the use of DC blocking capacitors for isolation of supply potentials. The DC blocking capacitors are subject to failure and the multiple coaxial cables passing through the ferrite cores increase the difficulty of fabrication.

A need has therefore been felt for a power amplifier unit in which a plurality of amplifying units can be coupled in parallel and can be operated between 0.5 MHz and 100 MHz and utilizing all solid state devices. A need has also been felt for a Class D amplifier device exhibiting 80%-90% efficiency that can utilize these power amplifier units. These power amplifier units can employ FET devices coupled in parallel to achieve output power in the multi-kilowatt range. A need has further been felt for an output transformer that can operate at these high frequencies while combining the output signals from the parallelly coupled power amplifiers and matching the impedance of the output power transistors with the impedance being driven by the transformer.

FEATURES OF THE INVENTION

It is therefore an object of the present invention to provide an improved radio frequency power amplifier.

It is a feature of the present invention to provide an improved switching amplifier suitable for Class D mode of operation.

It is a further feature of the present invention to provide method and apparatus for a power amplifier circuit employing power field effect transistor devices that can be operated in parallel with other similar amplifier devices.

It is yet another feature of the present invention to provide a signal processing unit suitable for use in a Class D amplifier that can operate in the radio frequency range from 1.6 MHz to 30 MHz frequency range and above.

It is still another feature of the present invention to provide an improved output transformer for combining the radio frequency signals and for impedance matching of the output impedance of the FET power transistors with the load impedance.

It is a more particular feature of the present invention to provide a transformer in which each power transistor is coupled to a metal cylindrical member and associated ferrite core, which forms the primary winding of the transformer, each ferrite core having a conductor cable transformer winding coupled passing therethrough, the conductor cable being the secondary winding.

SUMMARY OF THE INVENTION

The aforementioned and other objects are accomplished, according to the present invention, by providing a power amplifier circuit that can be coupled in parallel with other power amplifier circuits. The parallel amplifier circuits can be further coupled to another group of amplifier circuits, coupled in parallel, and the two groups of amplifier circuits can be operated in a push-pull mode of operation to drive an output load impedance. The amplifier circuit is comprised of a power field effect transistor device driven by a PNP and NPN emitter-follower circuit. For example, the driver circuits, in addition, provide an isolation mechanism for preventing spontaneous oscillation between the FET devices, coupled in parallel, of the power amplifier stage. The signal processing circuit is implemented with solid state devices that have the required frequency characteristics and provide a signal with appropriate characteristics for driving the power amplifier circuits. A transformer is disclosed that permits the combining of the output signals of the parallel amplifier circuits and does not rely on a multiple turn secondary winding for impedance matching. The transformer eliminates the need for DC blocking capacitors.

These and other features of the present invention will be understood by reading the following description along with the drawings.

BRIEF DESCRIPTION OF THE DRAWINGS

FIG. 7A is schematic diagram of an output amplifier for radio frequency power amplifiers according to the related art; while

DESCRIPTION OF THE PREFERRED EMBODIMENT

1. Detailed Description of the Figures

Figure 1:
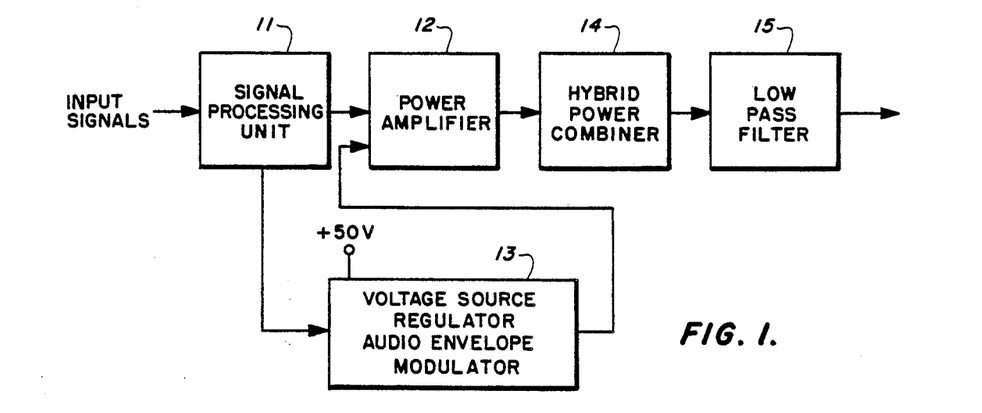
FIG. 1 is a block diagram of the components of a switching amplifier circuit acting in a Class D mode of operation.

Referring to FIG. 1, the block diagram of a high frequency switching amplifier acting in a Class D mode of operation is shown. Radio frequency input signals are applied to the signal processing unit 11. The output signal from the signal processing unit 11 is applied to power amplifier 12. A peak detector output signal from the signal processing unit 11 is applied to the voltage source regulator, audio envelope modulator 13 and can be used to control the +50 volt supply voltage for modulation of the power amplifier 12. By controlling the voltage applied to power amplifier 12 as a function of the modulation of the input RF signal, this modulation is now superimposed on the output signal. The RF output signal from the power amplifier 12 is applied to a hybrid power combiner 14, while the output signal from the hybrid power combiner 14 is applied to low pass filter 15. The RF output signal of the low pass filter 15 is the resultant output signal of the amplifier system.

Figure 2:
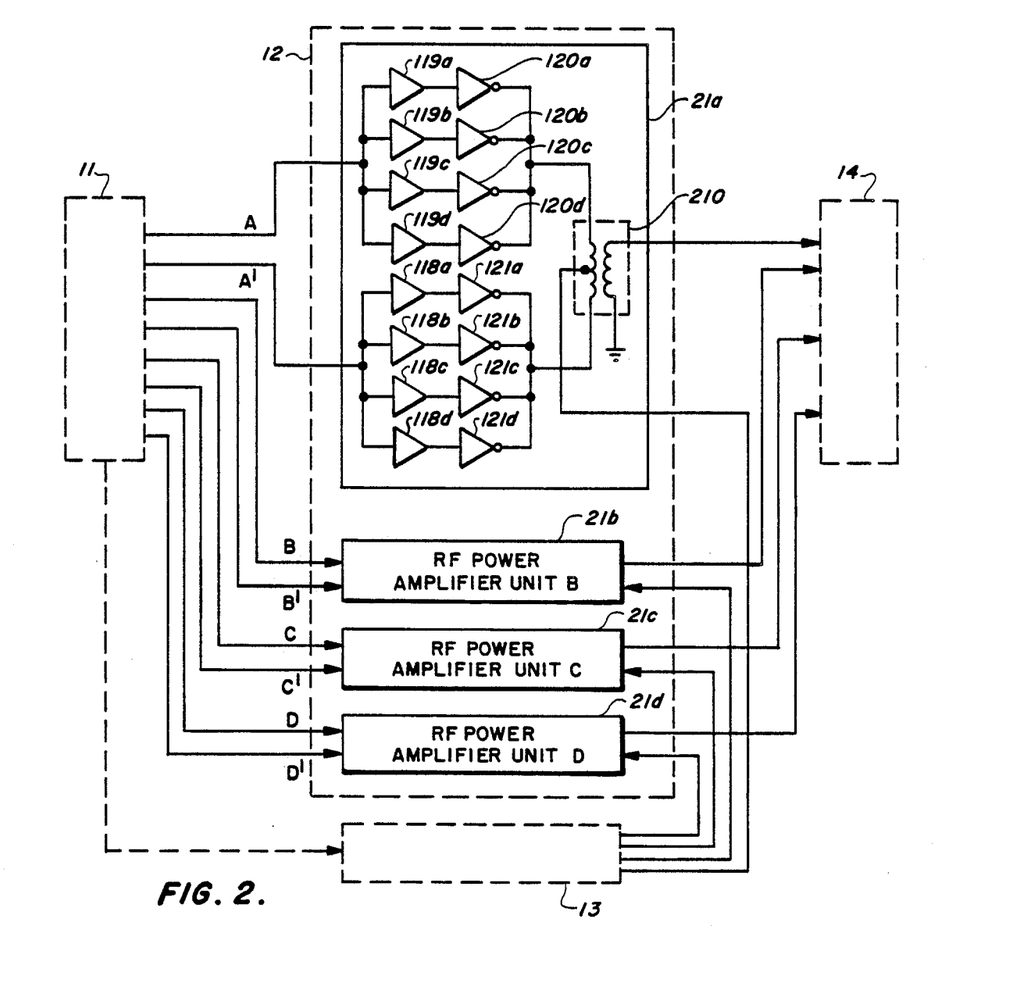
FIG. 2 is a more detailed block diagram of the power amplifier used in the switching amplifier of FIG. 1.

Referring next to FIG. 2, a more detailed block diagram of the power amplifier 12 of FIG. 1 is shown. Power amplifier 12 is shown as including four component RF power amplifier units, 21a, 21b, 21c and 21d. The RF power amplifier unit A of 21a is shown in more detail. A first group of final power amplifiers 120a, 120b, 120c and 120d are coupled in parallel and receive signals from driver amplifiers 119a, 119b, 119c and 119d respectively. The driver amplifiers receive RF carrier signals having a first phase (A) from signal processing unit 11. A second group of final power amplifiers 121a, 121b, 121c, and 121d, receiving signals from driver amplifiers 118a, 118b, 118c, and 118d respectively are operated in a push-pull relationship with the first group amplifiers and are driven by signals from signal processing unit 11 with a second phase (A'). The two sets of parallelly coupled amplifier circuits are operated in a push-pull mode; i.e., phase A and phase A' are 180 degrees out of phase and are coupled to a load impedance through the output transformer 210 that, in turn, supplies the output signal to hybrid power combiner 14. The voltage source regulator, audio envelope modulator circuit 13 applies signals to the power amplifier unit 21a. In the preferred embodiment, a plurality of RF power amplifier units 21b, 21c, and 21d can be coupled in parallel when additional power is required.

Figure 3:
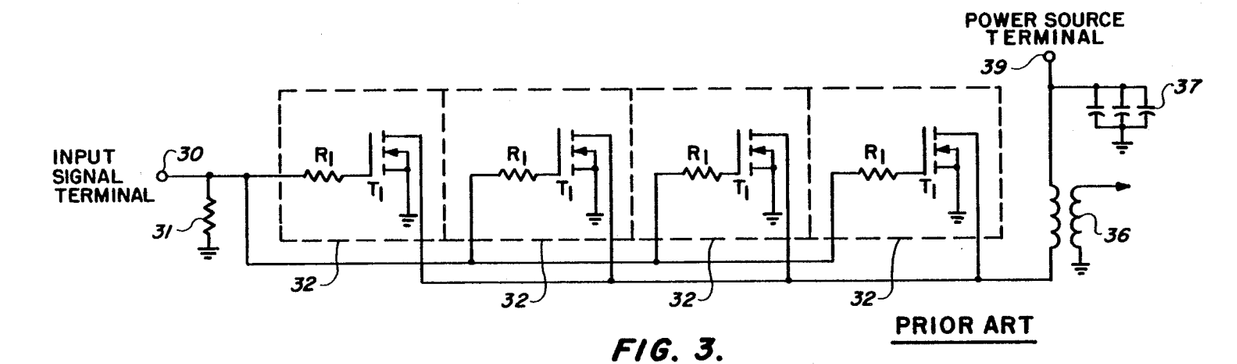
FIG. 3 is a circuit diagram of a multiplicity of power FET devices coupled in parallel according to the prior art.

Referring to FIG. 3, an example of the prior art, in which a circuit with field effect transistor devices coupled in a parallel configuration, is shown. In each amplifier circuit 32, a power supply voltage terminal 39 is coupled through a plurality of capacitors 37 to the ground potential and to one terminal of a load impedance (transformer) 36. A second terminal of the load impedance 36 is coupled to the drain terminal of the power FET device $T_1$ in each amplifier circuit 32. The source of each power FET device $T_1$ is coupled to ground, while the gate of each power FET device $T_1$ is coupled through a resistance $R_1$ to signal input terminal 30. The signal input terminal is also coupled through resistor 31 to a common potential.

Figure 4:
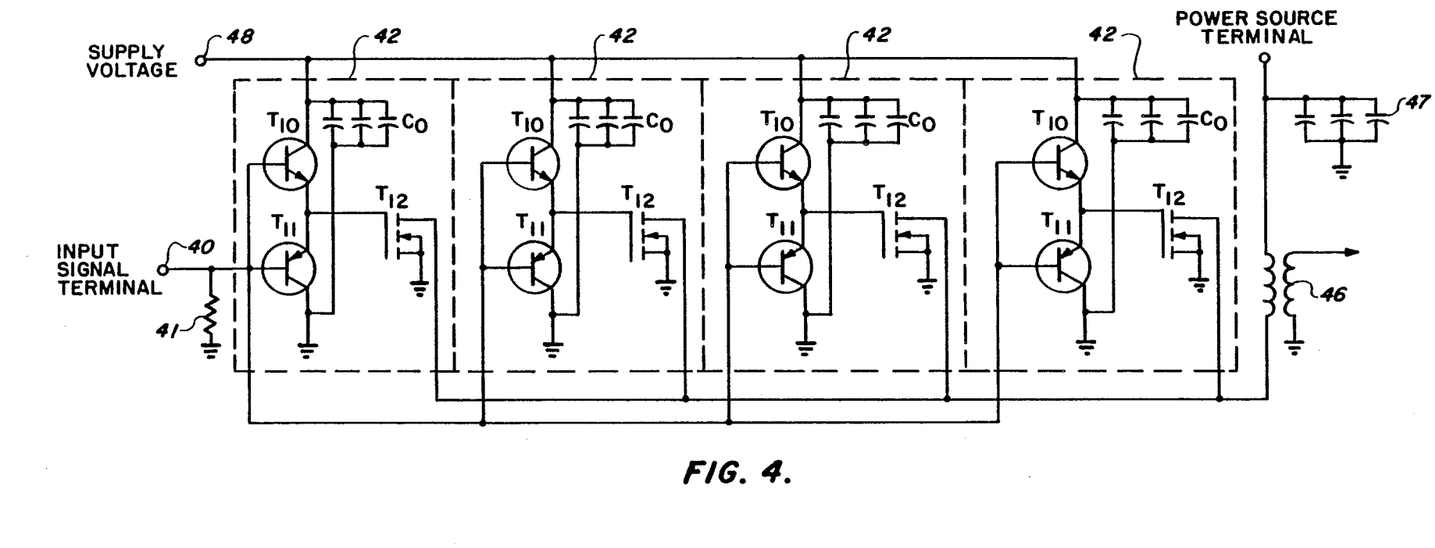
FIG. 4 is a circuit diagram of a multiplicity of power FET devices coupled in parallel according to the present invention.

Referring now to FIG. 4, the RF power amplifier unit in which a plurality of power FET devices are operated in parallel is shown. In each amplifier circuit 42, a signal input terminal 40 is coupled through resistor 41 to ground and is coupled to the base terminal of bipolar transistors $T_{10}$ and $T_{11}$ in each of the identical power amplifier circuits 42 of the unit. The power supply voltage terminal 48 is coupled to the collector terminal of NPN transistor $T_{10}$, while the collector terminal of PNP transistor $T_{11}$ is coupled to ground potential. The emitter terminal of transistor $T_{10}$ is coupled to the emitter terminal of transistor $T_{11}$, the two emitter terminals being coupled to the gate terminal of FET device $T_{12}$. The source terminal of FET device $T_{12}$ is coupled to the common potential, while the drain terminal of FET device $T_{12}$ is coupled to one terminal of the load impedance 46. A second terminal of load impedance 46 coupled to the power source 49 and through capacitors 47 to the common potential. Also coupled between the power supply voltage 48 and the common potential are a plurality of capacitors $C_0$ which decouples the power supply voltage 48 from the amplifier circuit 42.

Figure 5:
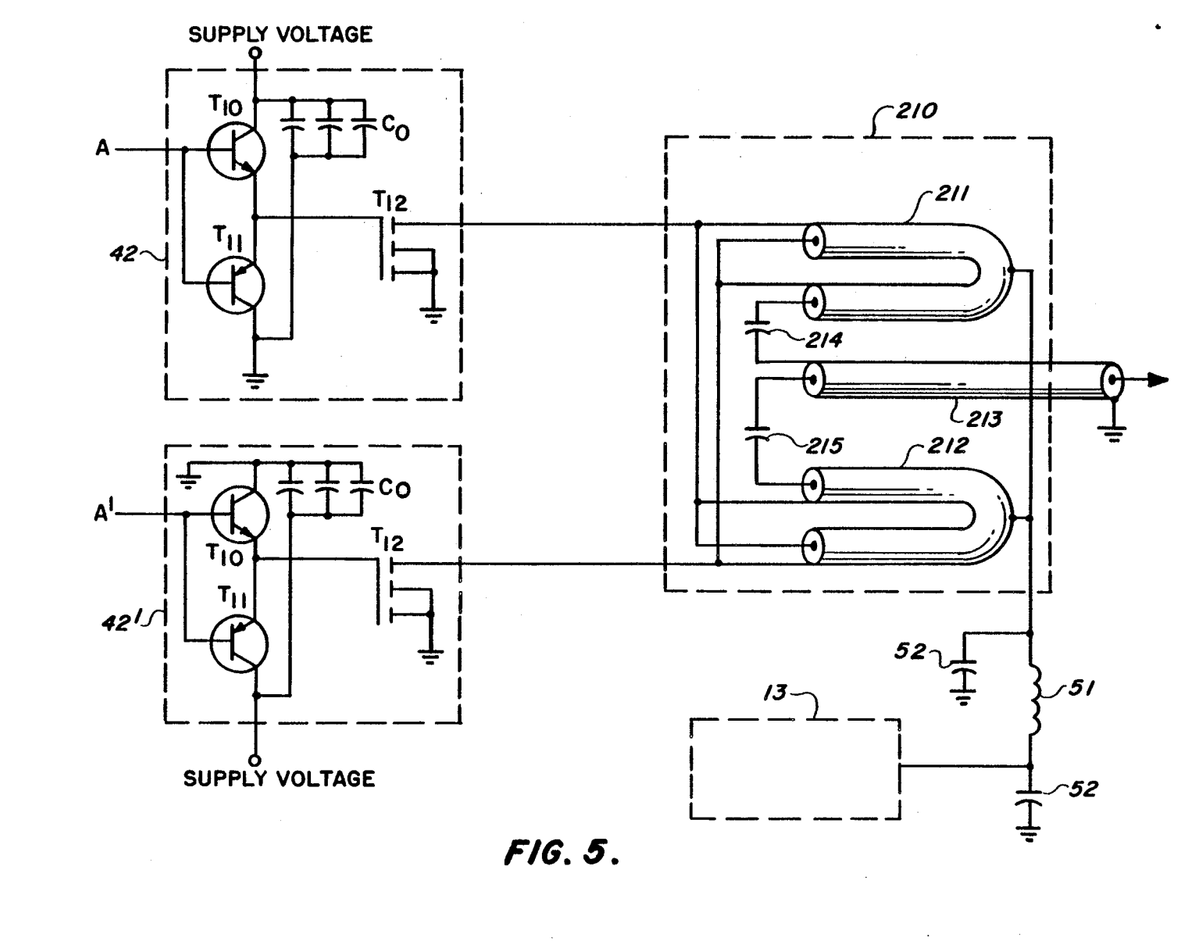
FIG. 5 is a circuit diagram of the final stage of two of the amplifier units of FIG. 4 driving a load impedance in a push-pull mode of operation.

Referring next to FIG. 5, the final output power amplifier circuits of the power amplifier units of FIG. 4 are shown coupled to a transmission line transformer 210 in a push-pull operational configuration. The drain output terminals of FET devices $T_{12}$ of unit 42 are coupled to a shield input terminal of transmission line 211 and to a shield output terminal and a center conductor input terminal of transmission line 212. The drain terminals of FET device $T_{12}$ in the opposite phase power amplifier unit 42' are coupled to a center conductor input terminal and to shield output terminal of transmission line 211 and to a shield input terminal of transmission line 212. The center conductor output terminal of the transmission line 212 is coupled through capacitor 215 to a center conductor input terminal of transmission line 213, while a center conductor output terminal of transmission line 211 is coupled through capacitor 214 to a shield input terminal of transmission line 213. An output signal from voltage source, regulator audio envelope modulator 13 is coupled through a filter, comprised of inductance 51 in capacitors 52, to intermediate terminals of transmission lines 211 and 212. The center conductor output terminal of transmission line 213 provides the output signal for power amplification unit 21a.

Figure 6A:
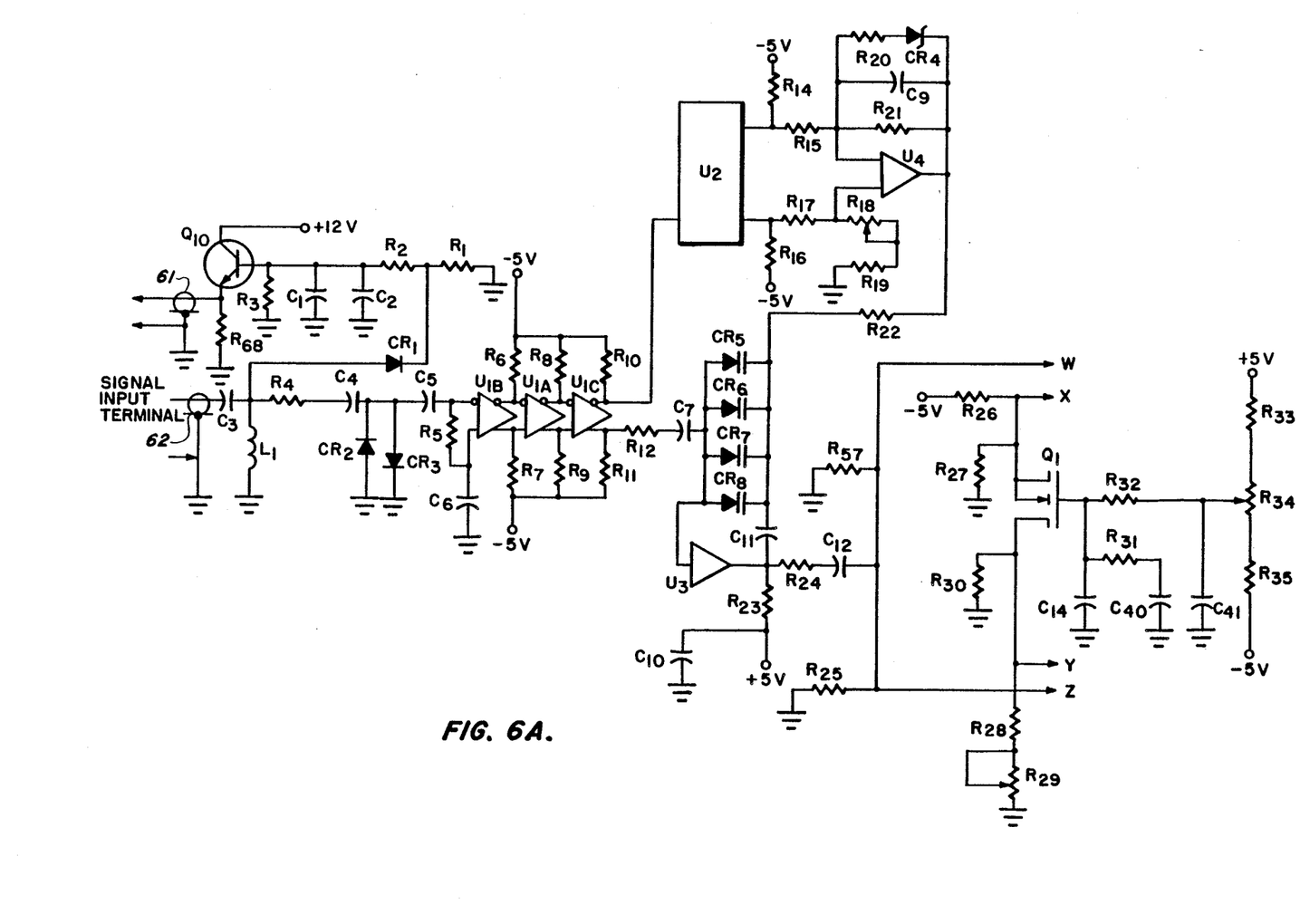
FIGS. 6a and 6b are a circuit diagram of the signal processing circuit for supplying an output signal to a high frequency power amplifier according to the present invention.
Figure 6B:
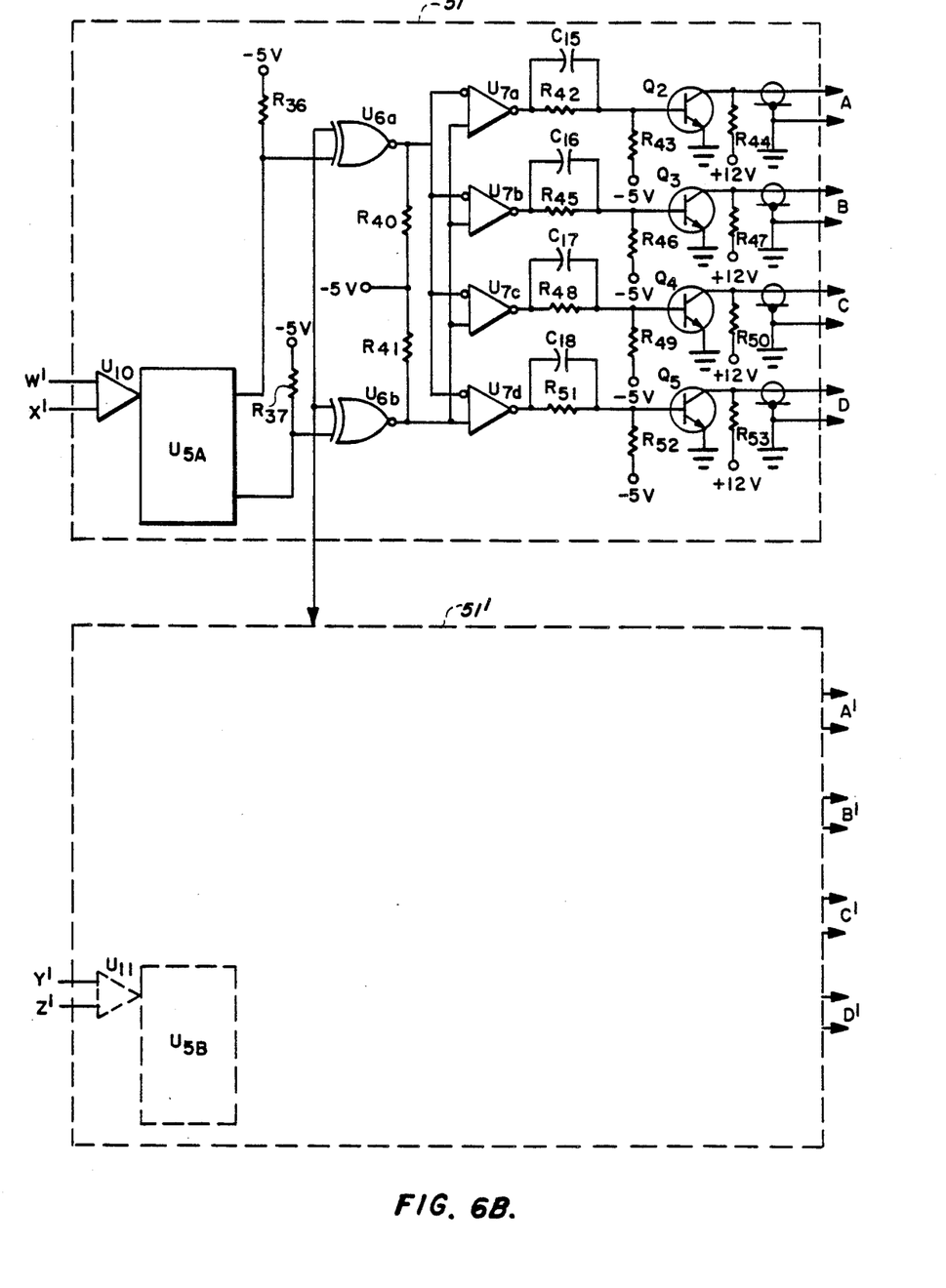

Referring now to FIG. 6a, an input terminal 62 receives the RF input signal. Input terminal 62 is coupled through capacitor $C_3$ to a first terminal of inductance $L_1$, to a first terminal of resistor $R_4$, and to an anode terminal of diode $CR_1$. A cathode terminal of diode $CR_1$ is coupled to a first terminal of resistor $R_1$, and to a first terminal of resistor $R_2$. A second terminal of resistor $R_1$ and a second terminal of inductor $L_1$ are coupled to the ground potential. A second terminal of resistor $R_2$ is coupled through capacitor $C_2$ to the ground potential, through capacitor $C_1$ to the ground potential through resistor $R_3$ to the ground potential and to the base of transistor $Q_{10}$. The emitter of transistor $Q_{10}$ is coupled through resistor $R_{68}$ to the ground potential and also is the output terminal for application of a signal to the voltage source regulator, audio envelope modulator unit 13. The collector or transistor $Q_{10}$ is coupled to the 12 volt power supply. A second terminal of resistor $R_4$ is coupled to capacitor $C_4$. A second terminal of capacitor $C_4$ is coupled through diodes $CR_2$ to the ground potential, through diode $CR_3$ to the ground potential and through capacitor $C_5$ to an inverted input terminal of amplifier $U_{1B}$. This terminal of amplifier $U_{1B}$ is also coupled through resistor $R_5$ to a second input terminal of amplifier $U_{1B}$ and the second input terminal of amplifier $U_{1B}$ is coupled through capacitor $C_6$ to the ground potential. The inverted output terminal of $U_{1B}$ is coupled to an inverted input terminal of $U_{1A}$ while a second output terminal of $U_{1B}$ is coupled to a second input terminal of $U_{1A}$. A first inverted output terminal of $U_{1A}$ is coupled to a first inverted input terminal of $U_{1C}$ while a second output terminal of $U_{1A}$ is coupled to a second input terminal of amplifier $U_{1C}$. The second output terminal of $U_{1C}$ is coupled through resistor $R_{12}$ and capacitor $C_7$ to a group of parallelly connected voltage controlled capacitor/diodes $CR_5$, $CR_6$, $CR_7$, $CR_8$ and an input terminal of amplifier $U_3$. A second inverted input terminal of amplifier $U_{1C}$ is coupled to an input terminal of monostable multivibrator $U_2$. The inverted output terminals of amplifiers $U_{1B}$, $U_{1A}$ and $U_{1C}$ are coupled through resistors $R_6$, $R_8$ and $R_{10}$, respectively, to a $-5$ volt power supply while the second output terminal of amplifiers $U_{1B}$, $U_{1A}$ and $U_{1C}$ are coupled respectfully through resistors $R_7$, $R_9$ and $R_{11}$ to a $-5$ volt power supply. The output terminal of amplifier $U_3$ is coupled through resistance $R_{23}$, to a $+5$ volt terminal and through capacitor $C_{11}$ to the cathodes of voltage controlled capacitor/diodes $CR_8$, $CR_7$, $CR_6$ and $CR_5$ and to a first terminal of resistor $R_{22}$. A second terminal of resistor $R_{22}$ is coupled to the output terminal of amplifier $U_4$ and to a first terminal of resistor $R_{21}$, a first terminal of capacitor $C_9$, and to the cathode terminal of diode $CR_4$. The anode of diode $CR_4$ is coupled through resistor $R_{20}$ to a second terminal of capacitor $C_9$, a second terminal of resistor $R_{21}$, to a first input terminal of amplifier $U_4$ and through resistor $R_{15}$ to an output terminal of monostable multivibrator $U_2$. The output terminal of monostable multivibrator $U_2$ is also coupled through resistor $R_{14}$ to a $-5$ volt supply. The second positive input terminal of amplifier $U_4$ is coupled through resistor $R_{17}$ to a second output terminal of monostable multivibrator $U_2$ and through a variable resistor $R_{18}$ in series with a resistor $R_{19}$ to the ground potential. A second terminal of resistor $R_{24}$ is coupled through capacitor $C_{12}$ to a positive input terminal of amplifier $U_{10}$ and to a negative input terminal of amplifier $U_{11}$. The negative amplifier terminal of $U_{11}$ is also coupled through resistor $R_{25}$ to the ground potential, while the positive inut terminal of amplified $U_{10}$ is coupled through resistor $R_{57}$ to ground potential. The positive input terminal of amplifier $U_{11}$ is coupled through resistor $R_{30}$ to ground and to a drain terminal of transistor $Q_1$. The source terminal of transistor $Q_1$ is coupled through resistor $R_{27}$ to ground potential, is coupled to an input terminal of amplifier $U_{10}$ and is coupled through resistor $R_{26}$ to the $-5$ volt power supply. The gate terminal of transistor $Q_1$ is coupled to a duty cycle control network $R_{31}$ through $R_{35}$ and $C_{14}$, $C_{40}$ and $C_{41}$ by adjusting the maximum voltage potential of the triangular wave signal from frequency integrator $U_3$. The amplifiers $U_{10}$ and the input network 51 in FIG. 6b is the point at which the network for the control signal and inverted control signal are duplicated, network 51 being replicated in network 51. The output terminal of amplifier U$_{10}$ is coupled to an input terminal of comparator U$_{5A}$. An output terminal of comparator U$_{5A}$ is coupled to an input terminal exclusive NOR gate U$_{6A}$ and through resistor R$_{36}$ to the −5 volt power supply. A second output terminal of comparator U$_{5A}$ is coupled to a first input terminal of exclusive NOR gate U$_{6B}$ and through resistor R$_{37}$ to the −5 volt supply. The second input terminal of exclusive NOR gate U$_{6A}$ and the second terminal of U$_{6B}$ are coupled together and to similar elements in the inverted signal circuit 51'. An output terminal of exclusive NOR gate U$_{6A}$ is coupled through resistor R$_{40}$ to the −5 volt supply and to inverted input terminals of amplifiers U$_{7D}$, U$_{7C}$, U$_{7B}$ and U$_{7A}$. The output of exclusive NOR gate U$_{6B}$ is coupled to input terminals of amplifier U$_{7A}$, U$_{7B}$, U$_{7C}$ and U$_{7D}$ and through R$_{41}$ to the −5 volt power supply. The output terminal of U$_{7A}$ is coupled through a parallelly coupled circuit of resistor R$_{42}$ and capacitor C$_{15}$ to a base terminal of transistor Q$_2$. The base terminal of transistor Q$_2$ is also coupled through resistor R$_{43}$ to the −5 volt power supply. The emitter terminal of transistor Q$_2$ is coupled to the ground potential while the collector terminal of transistor Q$_2$ is coupled through resistor R$_{44}$ to the +12 volt potential and provides the driving signal for the module A of the power amplifiers. Similar networks are shown for providing the output to power amplifier module B, power amplifier module C and power amplifier module D. The inverted 6A signals for these power amplifiers are provided by identical circuits in network 51.

Figure 7A:
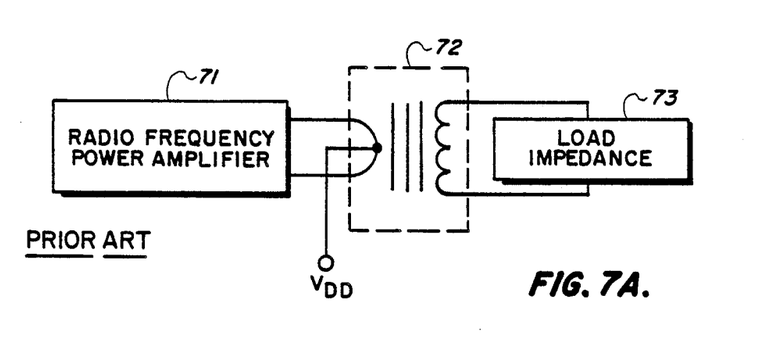
Figure 7B:
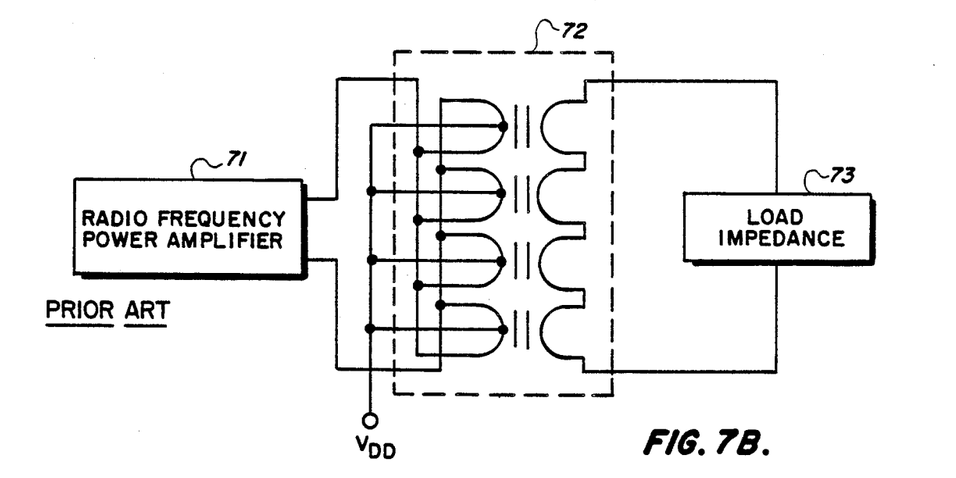
FIG. 7B and FIG. 7C are schematic diagrams of an output transformer for a plurality of radio frequency power amplifier units.
Figure 7C:
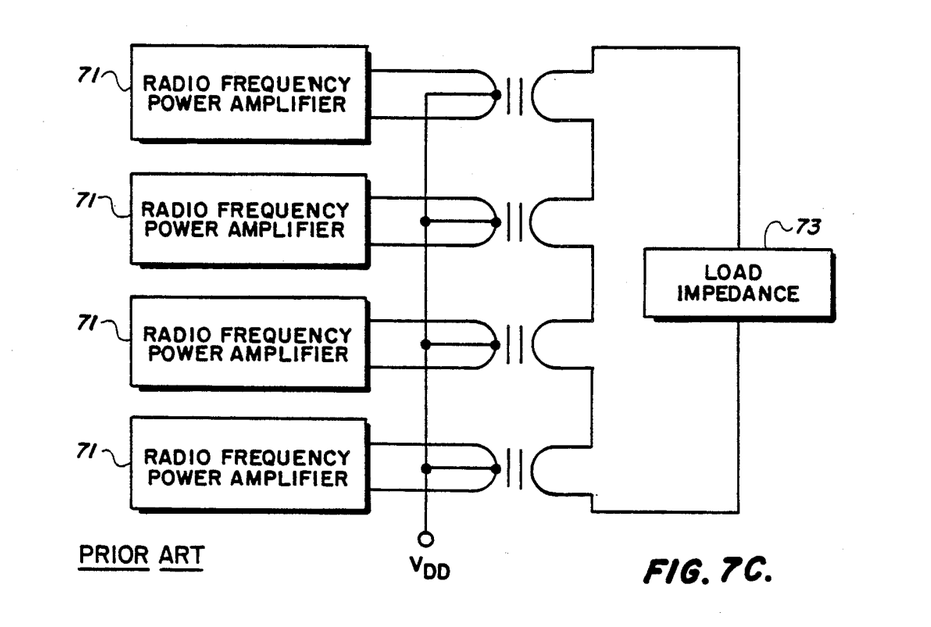

Referring next to FIG. 7A, FIG. 7B and FIG. 7C, the schematic diagram of an output transformer for a radio frequency power amplifier according to the prior art (FIG. 7A) is compared with output transformers for radio frequency power amplifiers according to the present invention (FIG. 7B and FIG. 7C) is shown. In FIG. 7A, the power amplifier 71 has output signals applied between the primary terminals of the transformer 72. The voltage source V$_{DD}$ is applied to the primary transformer winding center tap to provide power for the FET devices. The secondary winding of the transformer is coupled across an impedance 73, typically having a 50 Ohm impedance. FIG. 7B differs from the configuration of FIG. 7A in that the primary winding of transformer 72 has a plurality of parallelly coupled primary windings, each parallelly coupled primary winding being magnetically coupled to a one of a plurality of series coupled secondary winding (whereby forming a plurality of sub transformers). The configuration of FIG. 7C has a plurality of isolated power amplifiers, each coupled to a primary winding of transformer 72. Each primary winding is magnetically coupled to a one of a plurality of series coupled secondary windings (i.e., a unit transformer). When N$_P$, E$_P$, I$_P$ and Z$_P$ are defined as the number of turns of the primary winding, the voltage applied to the primary winding, the current flowing through the primary winding and the impedance seen by apparatus applied to the primary transformer winding, respectively, and N$_S$, E$_S$, I$_S$ and Z$_S$ are defined as the number of turns of the secondary winding, the voltage across the secondary winding, the current through the secondary winding and the impedance coupled to the secondary winding, respectively, then the following relationships are valid:

$$E_P = (N_P/N_S)E_S$$

$$I_P = (N_S/N_P)I_S$$

and $$Z_P = (N_P/N_S)^2 Z_S.$$

The third relationship is of particular interest because the impedance Z$_P$ being driven by the power amplifiers is relatively small compared to the output impedance of the FET devices of the power amplifiers. The typical manner of matching impedance is illustrated in FIG. 7A where the impedance matching is accomplished by adjusting the turns ratio of the primary and secondary winding. However, the same effect can be obtained, when the unit transformers have a one to one turns ratio, hy varying the number of unit transformers, i.e., in FIG. 7B or 7C. That is, 4 unit transformers provide an impedance matching configuration that is equivalent to a 4:1 turns ratio or a 16:1 impedance ratio. (It will be clear that a combination of turns ratio and number of unit transformers can be used for impedance matching configurations).

Figure 8:
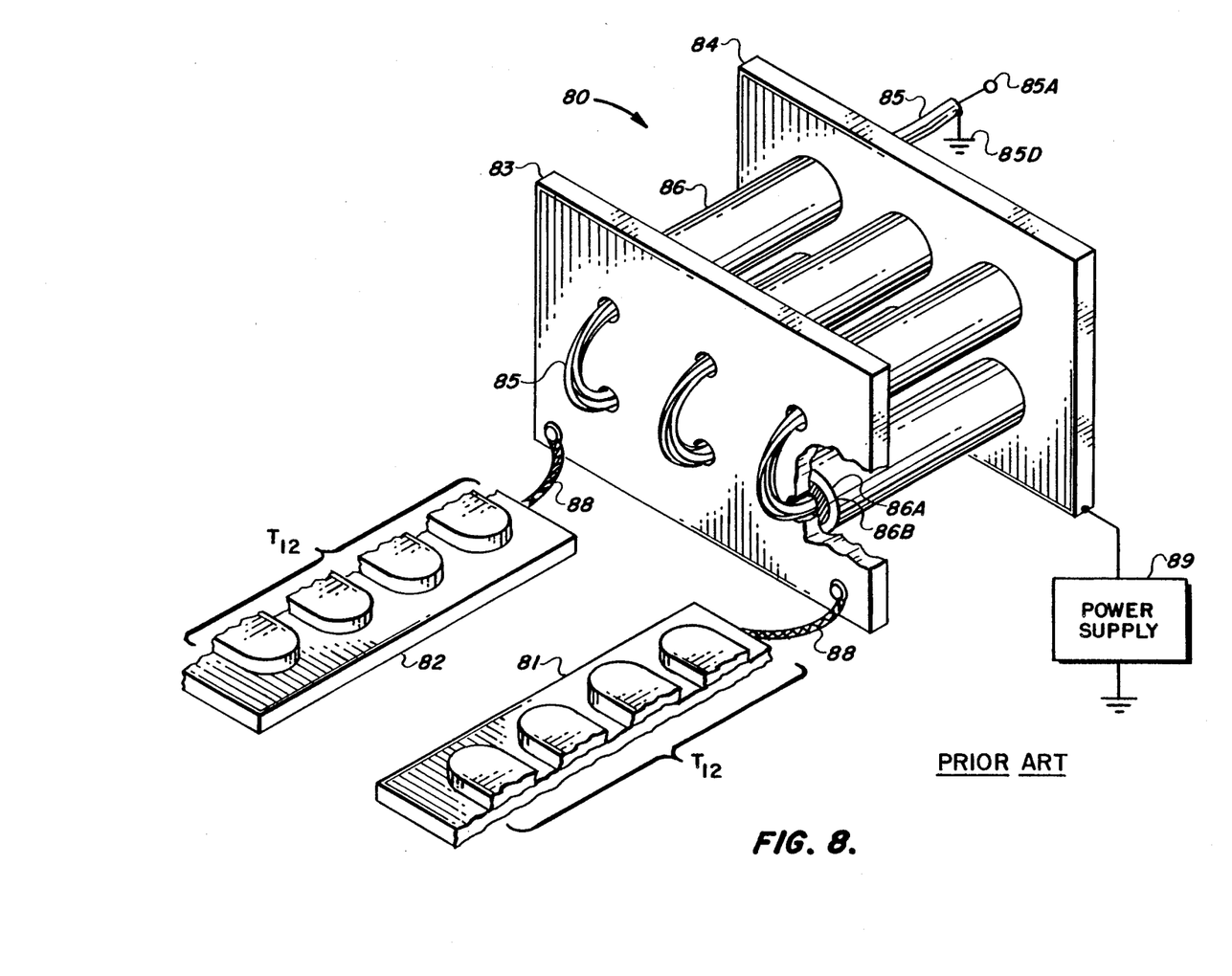
FIG. 8 is an exploded perspective view of a power output transformer suitable for use at radio frequencies according to the prior art.

Referring next to FIG. 8, a perspective view of a typical radio power amplifier transformer, according to the prior art, is shown. The FET devices T$_{12}$ from one phase of the push-pull amplifier configuration are coupled to conductor 81, while the second phase of the push-pull configuration is coupled to conductor 82. The power FET devices T$_{12}$ have the drain terminals coupled to the associated conductor and are, in addition, thermally coupled to the associated conductor, the associated conductor acting as a heat sink for the power FET devices. The conductors 81 and 82 are coupled to a conducting plate 83 of the transformer 80 by conducting leads 88. The transformer 80 includes, in addition to conducting plate 83, a conducting plate 84, a plurality oi ferrite devices 86, a plurality of blocking capacitors (not shown) and a plurality of coaxial cable segments 85 passing through each ferrite device 86. The output signal is provided by one segment of the coaxial cable segments at the center conductor 85A, the outer coaxial conductor of the output coaxial segment being coupled to the common potential 85B. The conducting plate 84 is coupled to the power supply 89. A cutaway section of the ferrite device 86 illustrates that the element 86 includes an inner copper cylinder 86B through which the coaxial segments are threaded. Surrounding the copper cylinder is a cylindrical structure of ferrite material 86A. The ends of the copper cylinders of the ferrite devices 86 are electrically and thermally coupled to the conducting plates 84 and 83, e.g. by soldering. The copper cylinders 86B are aligned with apertures in conducting plates 83 and 84 so that the coaxial cable segments can pass through the conducting plate apertures and the cylinders 86B.

Figure 9:
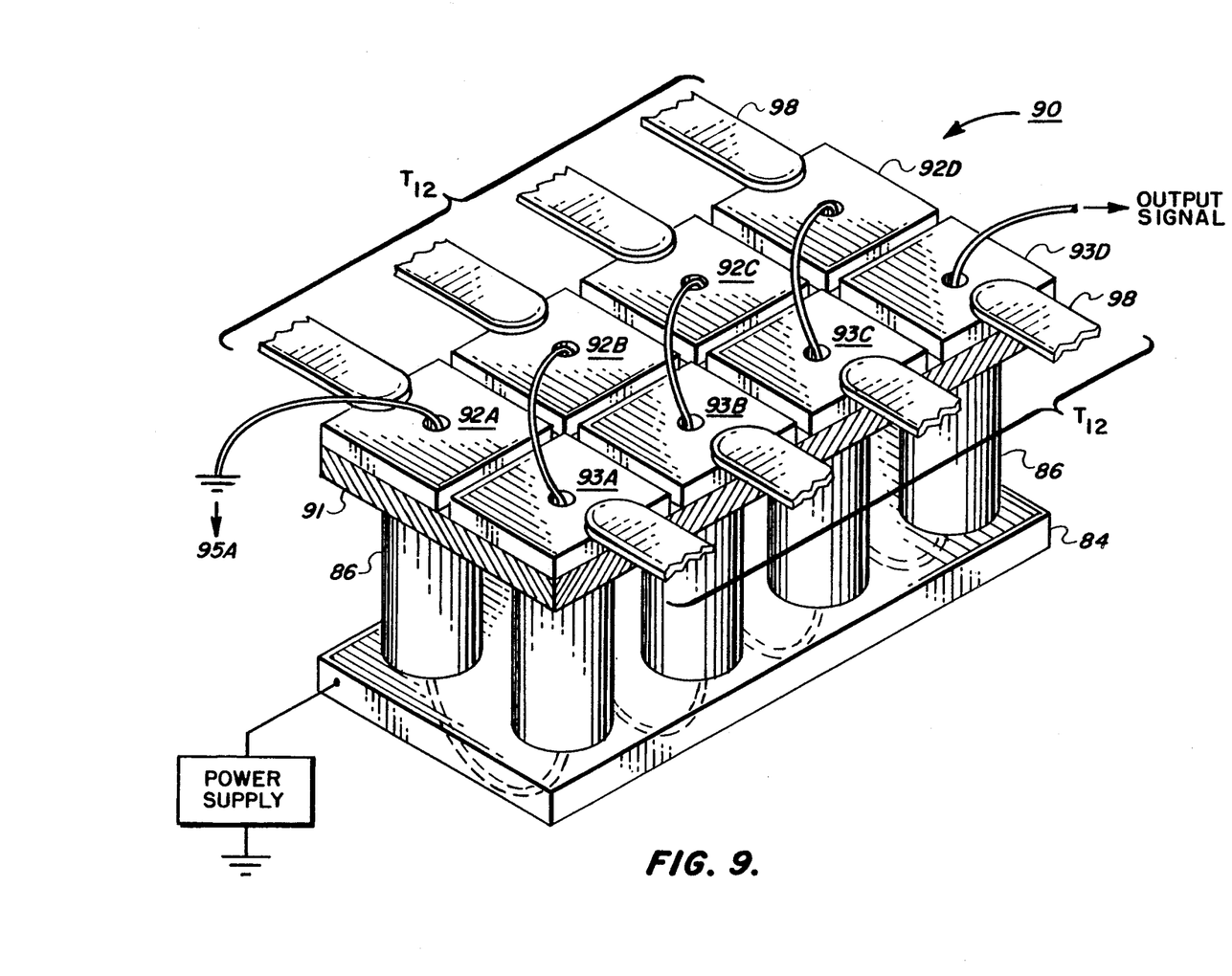
FIG. 9 is perspective view of the power output transformer suitable for use at radio frequencies according to the present invention.

Referring to FIG. 9, the radio frequency power transformer, according to the present invention is shown. As in FIG. 8, the power supply 89 is coupled to conducting plate 84. The ferrite devices 86 have the inner copper cylindrical member coupled electrically and thermally to the conducting plate 84, the copper cylinder of each ferrite device being aligned with an associated aperture in the conducting plate 84. The second end of the inner copper cylindrical member of each ferrite device is electrically and thermally coupled to conducting plate, the conducting plates designated as 92A through 92D and 93A through 93D. The copper plates 92A–92D and 93A–93D are supported by a dielectric plate 91, which electrically isolates the multiplicity of conducting plates 92A-92D and 93A-93D. Each of the conducting plates 92A-92D and 93A-93D is electrically and thermally coupled to an associated ferrite device, the copper cylindrical member being aligned with an aperture in the associated conducting plate. Coupled to each conducting plate 92A-92D and 93A - 93D is a power FET device $T_{12}$, the drain element of the FET device being coupled through a flange 98 to the associated conducting plate. Because of the power dissipated in the transistors $T_{12}$, the transistors $T_{12}$ must be mounted on separate cooling plates and coupled to the associated conducting plates 92A-92D and 93A-93D. (Recently, two FET power devices have been included in a single package. As will be clear, the power FET devices could be positioned on a cooling plate located between conducting plates 92A-92D and conducting plates 93A-93D). In the preferred embodiment, the conducting plates 92A-92D are associated with one phase of a push-pull power amplifier configuration, while conducting plates 93A-93D are associated with the second phase. A conducting wire 95, with an insulating coating, is threaded through each ferrite device 86. One terminal 95A of wire 95 is grounded while a second terminal 95B of wire 95 is the power output terminal for the transformer. The conducting wire 95 is threaded in a downward orientation with respect to ferrite core units associated with conducting plates 92A-92D and with an upward orientation with respect to the ferrite core units associated with conducting plates 93A-93D. The multi-port power transformer/power combiner impedance matching network type transformer primary windings are, in effect, electrically coupled in parallel, whereas the secondary windings are electrically coupled in series. This configuration provides both the impedance transformation and combining of the output (power) signals of the power FET amplifiers. The broad band performance of the RF transformer/power combiner is achieved by inserting toruses or sleeves of suitable magnetic material, such as ferrite over the metal tubes. Typical magnetic material for RF applications of this type can have an initial permeability of 200 to 1000. The common mode inductance of the RF transformer/power combiner is increased permitting operation at low frequencies. The high frequency performance is achieved by tight magnetic and capacitive coupling between the primary and the secondary windings. All magnetic materials dissipate some power in the form of heat, generated in the magnetic cores. The power dissipated depends on the power level and the frequency of the RF signal. Cooling of the transformer/combiner structure can be required.

2. Operation of The Preferred Embodiment

Referring once again to FIG. 4, the power amplifier for the switching circuit, four power amplifiers connected in parallel, are shown. The power FET device $T_{12}$, for example Motorola MRF 150, provides the output power to the load impedance, typically through a transformer or other impedance coupling element. The gate of power FET $T_{12}$ is driven by emitter-coupled transistors $T_{10}$ and $T_{11}$. Because of the internal capacitance of the transistors $T_1$ of the circuit in FIG. 3, the presence of the resistor $R_1$ provides a severe limitation with respect to frequency for values of $R_1$ that effectively prevent oscillation among the field effect transistors. This problem is alleviated by the use of two bipolar transistor $T_{10}$ and $T_{11}$ driving the field effect transistor $T_{12}$. However, the frequency can be limited by the physical characteristics of the transistors. In particular, although satisfactory NPN transistors $T_{10}$ are commercially available, such as the Motorola MRF 630, a suitable PNP transistor $T_{11}$ was not commercially available and had to be specialty manufactured. However, once the PNP transistor $T_{11}$ with suitable physical characteristics was implemented, then the output frequencies required for amplifier operation in the range above 10 MHz were achievable. As is standard procedure, a plurality of capacitors are coupled between the power supply and ground. It will be clear that the ability of transistor $T_{10}$ and transistor $T_{11}$ to discharge and charge current will provide the limitation on the frequency response of the field effect transistor $T_{12}$. It will also be clear to those skilled in the art that, at the frequencies for which the switching amplifier is intended, the final power amplifier device located the greatest distance from the load impedance provided an attenuated signal. It was found that, with the physical layout utilized in the implementation, more than four parallel power FETs did not provide sufficient increase in output power to warrant the additional parallel amplifier circuits. The number of amplifier circuits is limited by the physical configuration of the system.

Referring next to FIG. 5, and to FIG. 2, it is seen that the two stages of multiply-coupled amplifiers, driven in a push-pull mode of operation, can be used to provide additional power. The two push-pull stages are coupled to a transmission line-type transformer. In the preferred embodiment, a number of push-pull power amplifier units can be coupled together to provide yet an increase in the output power.

Referring to FIG. 6a, the signal processor unit 11, used for providing the requisite output signals for the power amplifier from the RF input signal, is shown. A peak detector circuit, including transistor $Q_{10}$ applies a signal in the 300 Hz to 3 KHz range to voltage source regulator, audio envelope modulator 13. The regulator/modulator 13 includes an audio amplifier that controls an emitter follower or voltage source regulator supplying the power source for the FET devices. The general technique is to apply amplitude information (i.e., the signal modulating the input RF signal) through the regulator/modulator 13 and phase information (i.e., the carrier signal of the RF input signal) through the signal processing unit 11, the two signals being combined in the output stage, i.e. load impedance 210. This technique is called envelope elimination and restoration. Diodes $CR_2$ and $CR_3$ provide an input diode clipping stage for the RF input signal, while amplifiers $U_{1A}$, $U_{1B}$, and $U_{1C}$ provide additional clipping. The output signal of $U_{1C}$ is a square wave. The voltage controlled capacitors/diodes $CR_5$, $CR_6$, $CR_7$, and $CR_8$ along with $U_3$ form a frequency integrator where the voltage controlled capacitors/diodes $CR_5$, $CR_6$, $CR_7$ and $CR_8$ help to keep the duty cycle constant by providing a constant amplitude triangular wave signal with the input signal carrier frequency signal at the output terminal of $U_3$. $U_2$, $U_4$ and associated components are a frequency to voltage converter and determines the integration time of the capacitors $CR_5$-$CR_8$ to maintain the constant amplitude triangular wave over the frequency range. The comparator $U_{5A}$ and its counterpart $U_{5B}$ are adopted to adjust the duty cycle of the wave and provide the ECL to TTL level conversion. Transistors $Q_2$ through $Q_5$ provide voltage amplification from the TTL level to the level required for the FET device, $T_{12}$ (typically 10 volts) to be fully turned on through the driver emitter follower $T_{10}$, $T_{11}$. Identical apparatus in network 51' provide the inverted phase signals. The signal processor unit output signals are applied to the emitter followers $T_{10}$, $T_{11}$ in FIG. 4. In this manner, a constant duty cycle can be provided that is independent of input signal frequency.

The emitter follower circuits provide sufficient current amplification to charge and discharge the input capacitances of FETs $T_{12}$. In general, however, prior to the development of RF power MOSFET semiconductors, such as the Motorola MRF 150 RF power MOSFET device and the development of emitter-coupled-logic (ECL) components, such as Motorola MC10198, for the monostable multivibrator $U_2$ and ECL components such as MC1650 for use as comparator $U_{5A}$ and $U_{5B}$ the development of signals in the 1.6 to 30.0 MHz radio frequency range and above MHz range and Class D amplification could not be implemented.

In addition, special high speed ECL Motorola versions of $U_1$ (i.e., MC10H116, MC10H195), $U_6$, $U_7$ and $U_8$, MC10H125 have recently become available along with similar devices from other manufacturers.

Referring again to FIG. 5, the output transformer of the related art is shown in detail in FIG. 8 and can be compared to FIG. 9, illustrating a multiport radio irequency transformer and power combiner. The parallelling of the power FET devices of the related art, as illustrated in FIG. 8 has several disadvantages. The varying distances of the power FET devices $T_{12}$ from the primary connection plate 83 can result in unequal power and out of phase contributions to the signals applied to the transformer primary terminal plate 83. The power FET devices $T_{12}$, being coupled in parallel, reduces the impedance to the transformer and requires that either the number of ferrite elements be increased or that the coaxial segments utilize the ferrite elements a plurality of times in order to obtain a suitable (50 Ohm) output impedance. The configuration of the power FET devices $T_{12}$, shown in FIG. 8, can cause cooling to be inefficient. The required use of the coaxial cable segments 85 as the output windings of this type of transformer, because of the physical size of the coaxial cables, results in difficulty of a plurality of cable segments being threaded through the ferrite elements. The use of DC blocking capacitors, shown schematically in FIG. 5 as elements 214 and 215, must be used in this type of radio frequency transformer implementation. This type of transformer is frequently referred to as a transmission line transformer. Not only does the presence of the DC blocking capacitors complicate the fabrication of the radio transformer, but these capacitors can become inoperative due to the high radio frequency currents flowing therethrough, thereby reducing the system reliability.

In the implementation illustrated in FIG. 9, the power FETs $T_{12}$ are coupled to the multiport radio frequency transformer/power combiner with DC power supply 89. The transformer/power combiner performs the impedance matching function between each power amplifier stage and the load impedance. Furthermore, the radio frequency power signals from the individual and multiple amplifier stages are automatically combined, and the transformer/power combiner also provides the necessary isolation between amplifiers stages. FIG. 7C illustrates transformer having broad band segments (1:1) wherein each push-pull amplifier pair transformer segment has its own primary winding and the resulting structure includes a common secondary winding (a 16:1 impedance ratio is illustrated) as the parallel amplifier design may dictate. The secondary winding wire 95, as compared to a plurality of coaxial cable segments, reduces the complexity of the fabrication of the transformer. Effectively, the primary windings are coupled electrically in parallel and the secondary windings are coupled in series. This configuration provides the required impedance transformation. This configuration results in a 16:1 impedance ratio using 4 sets of windings as illustrated in FIGS. 7B and 7C.

In addition, the absence of DC blocking capacitors not only reduces the complexity of the transformer fabrication, it increases the system reliability by eliminating components subject to failure. The natural DC isolation between the primary and the secondary winding in the implementation of FIG. 9 has further advantage over the configuration shown in FIG. 8 for providing isolation between each push-pull power device pair and the transformer/power combiner apparatus of FIG. 9 offers a unique function of radio frequency broad band transformer matching network and radio frequency signal combiner in one assembly (as illustrated in FIGS. 7B and 7C) and is an improvement of the method in which the power output signals from each push-pull FET amplifier pair in parallel as illustrated in FIG. 8.

This structure also allows DC drain voltage for the FET power devices to be supplied through the center tap of each primary winding, or alternatively, separated DC feed chokes can be used. This structure can function with any number of primary/secondary winding combinations which can be odd or even numbered resulting in different impedance ratios as the configuration requirements can dictate. Referring once again to FIG. 8 and FIG. 9, a comparison of the two power transformer implementations can be understood. The paralleling of the power FET devices as shown in FIG. 8 has several disadvantages. The varying distances of the power FET devices $T_{12}$ from the conducting plate 83 can result in out-of-phase contributions to the signal applied to conducting plate 83. The power FET devices $T_{12}$, being coupled in parallel, reduces the input impedance to the transformer and requires that either the number of ferrite devices be increased or that the coaxial segments utilize the ferrite devices a plurality of times in order to obtain a suitable (50 Ohm) output impedance. The configuration of the power FET devices $T_{12}$ shown in FIG. 8 can cause cooling to be complicated. The use of the coaxial cable segments 85 as the output windings of the transformer, because of the physical size of the cables, results in difficulty of a plurality of cable segments being threaded through the ferrite devices. The use of DC blocking capacitors, shown schematically in FIG. 5 as elements 214 and 215, must be used when coaxial cable segments are used in the power transformer implementation. Not only does the presence of the DC blocking capacitors complicate the fabrication of the transformer, but these capacitors can become inoperative requiring time-consuming and complex repair.

In the implementation illustrated in FIG. 9, the power FET devices $T_{12}$ are electrically coupled in series with respect to the transformer output circuit (involving each ferrite core) and not in parallel. However, the resulting RF output power of each amplifier ferrite core unit is coupled in parallel due to the equal phase relationships of both the FET power devices $T_{12}$ and the transformer/combiner unit, thereby transforming the output impedances of the FET devices into a higher impedance level in contrast to the configurations of the prior art where other impedance matching techniques are employed. This configuration not only provides impedance matching capabilities, but also results in combining of the output signals of the power amplifier circuits. The threading of a single conducting wire 95, as compared to a plurality of coaxial cable segments, reduces the complexity of fabrication of the transformer. The absence of DC blocking capacitors not only reduces the complexity of transformer fabrication, but decreases the maintenance by eliminating components subject to failure. The cooling of the transformer configuration of FIG. 9 is comparatively simple, the same air stream being capable of cooling the power FET devices and the ferrite devices.

The above description is included to illustrate the operation of the preferred embodiment and is not meant to limit the scope of the invention. The scope of the invention is to be limited only by the following claims. From the above description, many variations will be apparent that would yet be encompassed by the spirit and scope of the invention.

What is claimed is:

1. An RF transformer/power combining unit comprising:
   a conducting plate having apertures formed therein;
   a first plurality of RF broad band ferrite core units, each first plurality ferrite core unit having a conductive sleeve associated therewith and an aperture therethrough, each first plurality ferrite core unit having a first end of said conductive sleeve electrically coupled to said conducting plate, wherein apertures in said first plurality of ferrite core units are aligned with said conducting plate apertures; and
   a conductor cable enclosed in and insulating material passing through each of said first plurality ferrite core unit aperture and aligned conducting plate aperture, wherein a second end of each of said first plurality of ferrite core unit conductive sleeves is adapted to receive first radio frequency signals, each of said first radio frequency signals being substantially in phase, said conductor cable passing through each of said first plurality of ferrite core unit apertures in a first direction relative to said conducting plate, wherein signals induced in said conductor cable by said radio frequency signals are additive.

2. The transformer/power combining unit of claim 1 further comprising a second plurality of ferrite core units, each second plurality ferrite core unit having a conductive sleeve associated therewith and an aperture therethrough, each second plurality ferrite core unit having a first end of said conductive sleeve electrically coupled to said conducting plate, wherein apertures in said second plurality ferrite core units are aligned with said conducting plate apertures, said conductor cable passing through each of said second plurality of ferrite core unit apertures and aligned conducting plate apertures in a second direction relative to said conducting plate, wherein a second end of each of said second plurality ferrite core unit conductive sleeves is adapted to receive second radio frequency signals, each of said second radio frequency signals being substantially 180° out of phase with said first radio frequency signals.

3. The transformer/power combining unit of claim 2 wherein an impedance transformation of said transformer/power combining unit is a function of the number of said first and second plurality of ferrite core units.

4. The transformer/power combining unit of claim 2 wherein each of said first and second plurality of ferrite core units include a metal tube forming said conductive sleeve and ferrite material, said ferrite material surrounding said metal tube.

5. The transformer/power combining unit of claim 4 wherein said conducting plate is adapted to be coupled to a power supply and wherein a second end of each of said conductive sleeves is adapted to be coupled to a RF power amplifier, said RF power amplifiers providing said radio frequency signals.

6. The transformer/power combining unit of claim 5 wherein said second end of said first and said second plurality of said ferrite core unit conductive sleeves are electrically isolated, said electrical isolation preventing failure of one of said RF amplifiers from resulting in a failure of other of said RF amplifiers.

7. The transformer/power combining unit of claim 5 wherein said conducting plate is a heat sink for said first and said second plurality of ferrite core units, wherein said conducting plate is thermally coupled to heat sinks associated with said RF power amplifiers.

8. The transformer/power combining unit of claim 2 wherein said first and second plurality of ferrite core units are positioned with respect to sources of said radio frequency signals to substantially equalize the signal delays therebetween.

9. The transformer/power combining unit of claim 2 wherein said conductor cable has a first end coupled to a ground potential.

10. The transformer/power combining unit of claim 2 wherein said first radio frequency signals and said 180° out of phase second radio frequency signals provide a push-pull mode of operation for said transformer/power combining unit.

11. A power amplifier stage for use as a switching amplifier in the 1.6 MHz to 30 MHz R(adio) F(requency) range comprising:
   a plurality of N-channel power field effect transistors, each of said power field effect transistors having a source terminal coupled to a common potential;
   a plurality of active driver circuits, each of said drive circuits coupled to a common input terminal, each of said active driver circuits coupled to a gate of an assocated power field effect transistor, each driver circuit charging and discharging a gate terminal of said associated power field effect transistor thereby decoupling said associated gate terminal from gate terminals of others of said plurality of field effect transistors; and
   a transformer/power combining unit including:
      a plurality of RF broad band ferrite core units, each ferrite core unit having a conductive sleeve associated therewith and an aperture therethrough enclosed by said sleeve, each ferrite core unit conductive sleeve adapted to have a first end energized by a drain terminal of an associated power field effect transistor, wherein a second end of each ferrite core unit conductive sleeve is adapted to coupled to a power supply, said power supply energizing said power field effect transistor; and
      a conductor cable passing through each of said ferrite core unit conductive sleeves, wherein said conductor cable has a predefined orientation with respect to each conductive sleeve through which said conductor cable passes, wherein said conductor cable has a first orientation with respect to a conductive sleeve when said associated power field effect transistor is operater in a first phase, said conductor cable having a second orientation with respect to said conductive sleeve when said associated power field effect transistor is operated substantially 180° out of phase with said first phase.

12. A transformer/power combining unit comprising:

a plurality of ferrite core units, each ferrite core unit having an aperture therethrough, each ferrite core unit including a conductive sleeve, said conductive sleeve enclosing said aperture, a first end of each conductive sleeve adapted to be energized by an RF power amplifier, a second end of each conductive sleeve adapted to be coupled to a power supply; and at least one conductor cable passing through each of said ferrite core unit conductive sleeves, each conductor cable enclosed by an insualting material, said conductor cable passing through a conductive sleeve of each of a first group of said plurality of ferrite core units with a first orientation relative to ends of said conductive sleeve through which said conductor cable passes, said conductor cable passing through a conductive sleeve of each of a second group of said plurality of ferrite core units with a second orientation relative to ends of said conductive sleeve through which said conductor cable passes, wherein said first group of ferrite core units is energized by RF power amplifiers applying first signals to said first group of ferrite cores units substantially in phase, said second group of ferrite core units energized by RF power amplifiers applying second signals to said second group of ferrite core units substantially 180° out of phase with said ferrite core units.

13. The transformer/power combining unit of claim 12 further comprising a conducting plate having apertures therethrough, wherein said conducting plate is electrically coupled to said second conductive sleeve ends, each aperture enclosed by said conductive sleeves aligned with an aperture of said conducting plate adapted to be coupled to said power supply.

14. The transformer/power combining unit of claim 13 wherein said ferrite core units are positioned with respect to said RF power amplifiers to provide substantially equal signal delays therebetween.

15. The transformer/power combining unit of claim 13 wherein a first end of said conductor cable is coupled to ground potential.

16. The transformer/power combining unit of claim 13 wherein input terminals of said ferrite core unit conductive sleeves are electrically coupled to a remainder of said ferrite core unit conductive sleeves only by said conducting plate, said electrical coupling preventing a failure of one RF power amplifier from affecting operation of other RF power amplifiers.

17. The transformer/power combining unit of claim 13 wherein said RF power amplifiers include power field effect transistors, output signals from said power field effect transistors being combined in said conductor cable.

18. The transformer/power combining unit of claim 13 wherein said conducting plate acts as a heat sink for said plurality of ferrite core elements.

* * * * *